United States Patent [19]

Yaoita

[11] Patent Number: 5,529,958
[45] Date of Patent: Jun. 25, 1996

[54] METHOD OF MANUFACTURING A SEMICONDUCTOR DEVICE HAVING SILICIDE

[75] Inventor: Akihiro Yaoita, Tokyo, Japan

[73] Assignee: NEC Corporation, Tokyo, Japan

[21] Appl. No.: 301,413

[22] Filed: Sep. 8, 1994

[30] Foreign Application Priority Data

Sep. 17, 1993 [JP] Japan ................... 5-230631

[51] Int. Cl.⁶ .............................. H01L 21/768
[52] U.S. Cl. .......................... 437/200; 437/201
[58] Field of Search ................ 257/754, 757, 257/769, 770; 437/200, 201; 148/DIG. 147

[56] References Cited

U.S. PATENT DOCUMENTS

| | | | |
|---|---|---|---|
| 4,141,022 | 2/1979 | Sigg et al. | 437/201 |
| 4,322,453 | 3/1982 | Miller | 437/201 |
| 4,378,628 | 4/1983 | Levinstein et al. | 257/755 |
| 4,690,730 | 9/1987 | Tang et al. | 437/200 |
| 5,010,037 | 4/1991 | Lin et al. | 257/757 |
| 5,023,201 | 6/1991 | Stanasolovich et al. | 437/200 |
| 5,047,367 | 9/1991 | Wei et al. | 437/201 |
| 5,162,259 | 11/1992 | Kokor et al. | 437/200 |
| 5,217,924 | 6/1993 | Rodder et al. | 437/200 |
| 5,346,860 | 9/1994 | Wei | 437/200 |
| 5,387,535 | 2/1995 | Wilmsmeyer | 437/200 |

FOREIGN PATENT DOCUMENTS 03008371  1/1991  Japan ................... 257/757

OTHER PUBLICATIONS

S. Wolf, "Silicon Processing for the VLSI Era, vol. 2", Lattice Press, 1990, p. 146.
S. Wolf, "Silicon Processing for the VLSI Era, vol. 2: Process Integration", Lattice Press, 1990, p. 151.
"Resistance and structural stabilities of epitaxial $COSi_2$ films on (001) Si substrates", HSIA et al., J. Appl. Phys., vol. 72(5), Sep. 1992, pp. 1864–1873.
"Epitaxial growth of $COSi_2$ on both (111) and (100) Si substrates by multistep annealing of a ternary Co/Ti/Si system", Liu et al., J. Appl. Phys. 74(3), Aug. 1993, pp. 1700–1706.

Primary Examiner—George Fourson
Assistant Examiner—Thomas G. Bilodeau
Attorney, Agent, or Firm—Popham, Haik, Schnobrich & Kaufman, Ltd.

[57] ABSTRACT

The present invention relates to a method of manufacturing a semiconductor device, including the steps of forming, on a silicon substrate, a metal film to be converted into a silicide, continuously forming a thin film on the metal film, and performing annealing of a structure body constituted by the silicon substrate, the metal film, and the thin film at a temperature at which the metal film is reacted with the silicon substrate.

1 Claim, 3 Drawing Sheets

FIG. IA
PRIOR ART
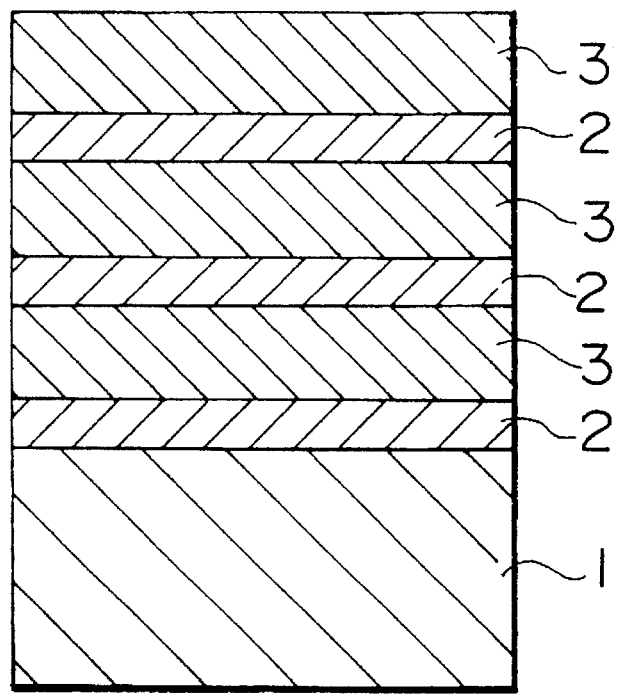
FIG. IB
PRIOR ART
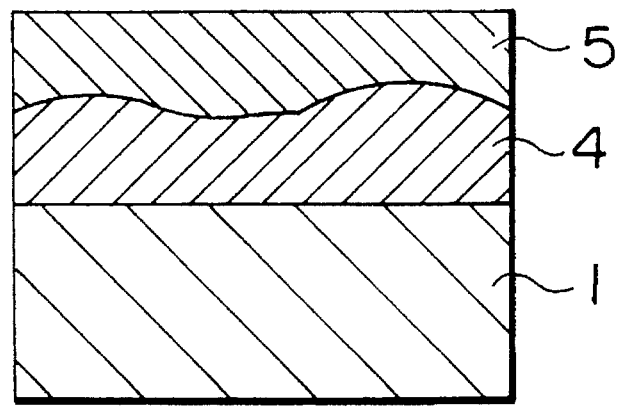

METHOD OF MANUFACTURING A SEMICONDUCTOR DEVICE HAVING SILICIDE

FIELD OF THE INVENTION

The present invention relates to a method of manufacturing a semiconductor device and, more particularly, to a method of manufacturing a semiconductor device having a silicide.

DESCRIPTION OF THE RELATED ARTS

As a conventional method, a method using cobalt will be described. To form the silicide of cobalt (to be referred to as cobalt silicide hereinafter), cobalt is directly deposited on a silicon substrate using the sputtering or CVD method to form a cobalt thin film layer. The resultant structure is annealed by the RTA method or the like. With this annealing, cobalt is reacted with silicon to form cobalt silicide. The cobalt silicide formed by this method is polycrystalline.

To recrystallize the cobalt silicide to a monocrystalline silicon, there is a method in which a multilayered film is formed by sequentially depositing titanium and cobalt on silicon, and the resultant structure is annealed (e.g., J. Appl. Phys., vol. 72(5), 1 Sep. 1992). This method uses a structure having a titanium layer 2 and a cobalt layer 3 sequentially formed on a silicon substrate 1 by sputtering, as shown in FIG. 1A. Thereafter, the RTA method, furnace annealing, or the like progresses a reaction to cause inversion of the titanium and cobalt layers. As a result, a mixture layer 5 obtained upon reactions among $CoSi_2$, cobalt, titanium, and silicon is formed, as shown in FIG. 1B.

As a method of manufacturing cobalt silicide, 4 a method using ion implantation of cobalt or molecular beam epitaxy is considered.

In the above-described prior art, when only the cobalt film layer is formed, and thereafter, the silicide is formed by annealing, three-dimensional patterns are formed at an interface between the silicide 4 and the substrate. Additionally, since the silicide 4 formed by this method is polycrystalline, agglomeration occurs upon annealing at high temperature. To eliminate these drawbacks, a method using a multilayered film of titanium and cobalt has been proposed. According to this method, the crystallinity of the cobalt silicide and the three-dimensional patterns at the interface with respect to the substrate are improved. However, a process of removing films except for the cobalt silicide film, which are formed after formation of the silicide, is added. In addition, three-dimensional patterns are formed on the surface of the silicide film to impair micropatterning of devices. To avoid this problem, two-stage annealing can be performed such that annealing is performed at a low temperature, the upper unreacted layer is wet-etched, and thereafter, annealing is performed at a high temperature. However, this method complicates the processes.

Other methods complicate the manufacturing process of devices or are unsuitable for mass-production. More specifically, in a method using ion implantation of cobalt, a process is added to coat the resultant structure with a resist or the like not to implant ions in an unnecessary region. Molecular beam epitaxy is very poor in throughput.

SUMMARY OF THE INVENTION

The present invention has been made to solve the above problems in the prior art, and has as its object to provide a method of manufacturing a semiconductor device having a silicide, which improves the quality of crystal by a simple method to increase a resistance to agglomeration and can be applied to a finer device.

In order to achieve the above object, according to the main aspect of the present invention, there is provided a method of manufacturing a semiconductor device, comprising the steps of forming, on a silicon substrate, a metal film to be converted into a silicide, continuously forming a thin film on the metal film, and performing annealing of a structure body constituted by the silicon substrate, the metal film, and the thin film at a temperature at which the metal film is reacted with the silicon substrate.

In the main aspect, the metal film is formed of a material selected from the group consisting of cobalt, nickel, platinum, and palladium to have a thickness of 5 to 40 nm.

In the main aspect, the annealing is performed in a nitrogen atmosphere at a temperature of 600° to 700° C.

In the above aspect, the thin film is (1) a metal thin film formed of a material selected from the group consisting of titanium, tungsten, and molybdenum, (2) an insulating thin film such as a silicon oxide film or a silicon nitride film, or (3) a silicide thin film such as a platinum silicide film or a tungsten silicide film.

According to the manufacturing method of the present invention, the processes can be simplified as compared to a conventional manufacturing method using a structure of Co/Ti/Co/Ti/Co/Ti—Si substrate. The same processes as those in the conventional method can be performed except that a process of continuously forming a titanium film after formation of a cobalt film is added as compared to a method of forming only a cobalt film. In addition, since cobalt silicide obtained by the manufacturing method of the present invention is monocrystalline, the resistance to agglomeration increases. Furthermore, since a specific orientation is obtained to planarize an interface between the substrate and the silicide, and the surface of the silicide, a silicide film suitable for micropatterning devices can be formed.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

BRIEF DESCRIPTION OF THE DRAWINGS

FIGS. 1A and 1B are sectional views of a semiconductor device, which explain a conventional manufacturing method;

DETAILED DESCRIPTION OF THE PREFERRED EMBODIMENTS

Figure 2A:
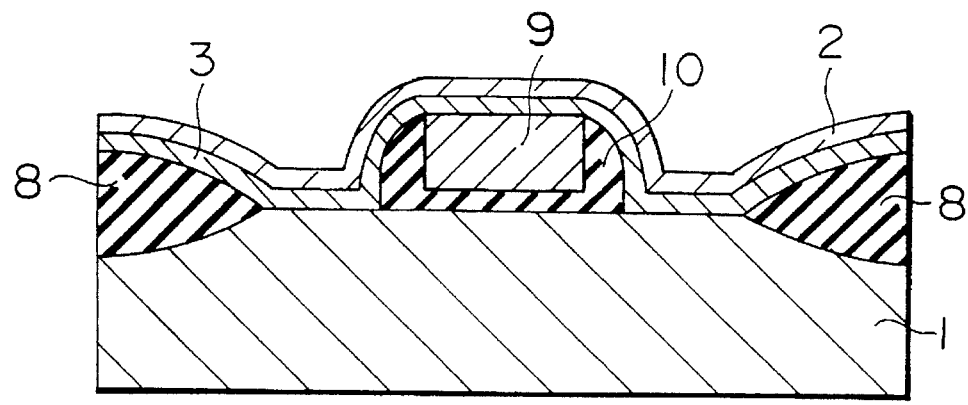
FIGS. 2A to 2C are sectional views of a semiconductor device, which explain an embodiment of a manufacturing method of the present invention.
Figure 2B:
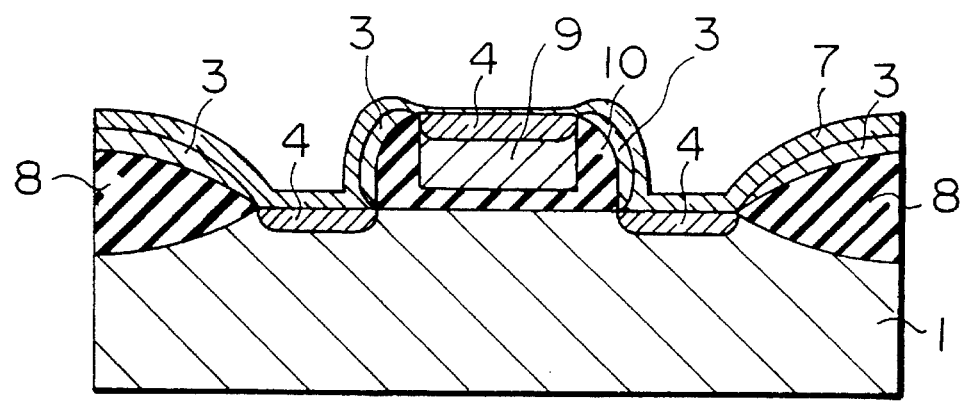
Figure 2C:
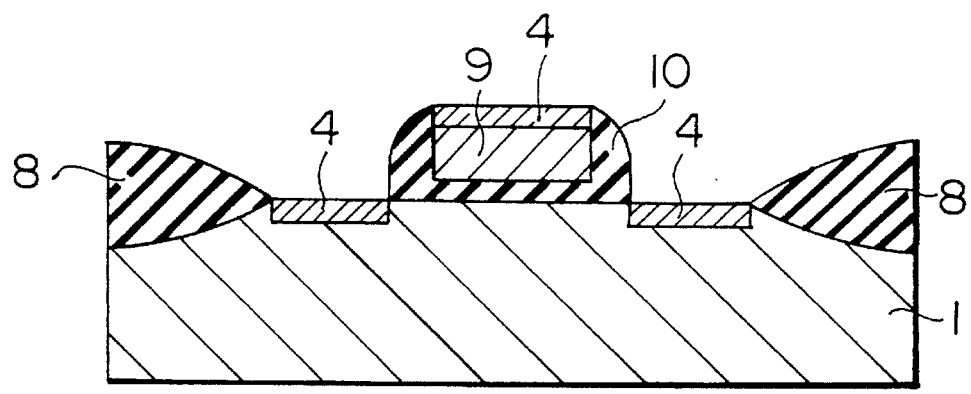
Figure 3:
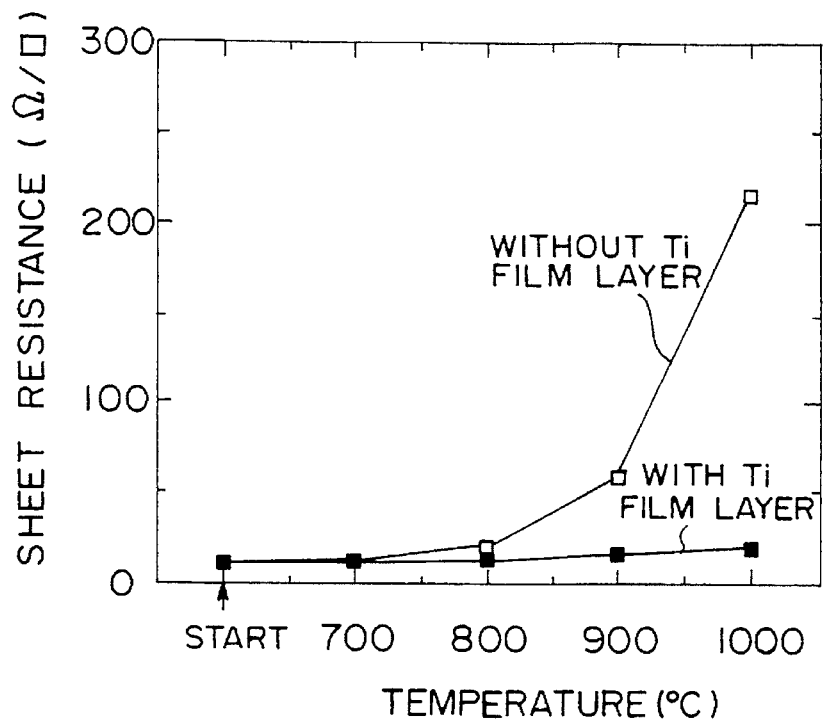
FIG. 3 is a graph of temperature vs. sheet resistance characteristics, which shows the effect of the semiconductor device obtained by the manufacturing method of the present invention.

An embodiment of the present invention will be described below in detail with reference to the accompanying drawings. FIGS. 2A to 2C are sectional views showing the steps in manufacturing of a semiconductor device according to an embodiment of the present invention. In this embodiment, the present invention is applied to a silicide process. In this process, silicon on the gate 9, the source, and the drain of a MOS device is self-aligned with a silicide. According to the present invention, a cobalt film layer 3 is formed on a MOS device, as shown in FIG. 2A, by sputtering. Although cobalt is exemplified in this embodiment, nickel, platinum, palladium may also be used. Similarly by sputtering, titanium is continuously sputtered to form a thin titanium film layer 2 on the cobalt film layer 3. Both the cobalt film layer 3 and the titanium film layer 2 have a thickness of 10 nm. The thickness of these films is not limited to 10 nm and may be thicker or thinner. When the cobalt film layer 3 and the upper layer 2 are formed to be thinner, e.g., to have a thickness of 5 nm, they can cope with formation of the thin film of a finer device. After formation of the multilayered structure of the cobalt film layer 3 and the titanium film layer 2, the resultant structure is annealed at about 700° C. using the RTA method or the like. With this process, the cobalt film layer 3 which is in direct contact with a silicon substrate 1 is converted into a silicide to form a cobalt silicide ($CoSi_2$) layer 4, as shown in FIG. 2B. The cobalt film layer 3 on the silicon oxide film of an element isolation region 8 or a side wall 10 is not converted into a silicide and is kept unreacted. At this time, when the annealing is performed in a nitrogen atmosphere, the upper titanium film layer 2 is converted into a titanium nitride film layer 7. As shown in FIG. 2C, the unreacted cobalt film layer 3 and the titanium nitride film layer 7 can be selectively removed by a solution mixture of, e.g., $NH_4OH:H_{2O2}:H_2O =1:1:5$. That is, in the silicide manufacturing method of the present invention, the same processes as those in the normal silicide process can be performed except that the titanium film layer 2 is formed on the cobalt film layer 3. The cobalt silicide formed at this time has one specific crystal orientation as compared to a silicide obtained when only a cobalt film layer is formed. Additionally, the three-dimensional patterns at an interface between the substrate and the silicide are almost eliminated. Without the titanium film layer, the sheet resistance of the cobalt silicide layer 4 increases at 900° C. to cause agglomeration, as shown in FIG. 3. However, when the titanium film layer 2 is formed on the cobalt film layer 3, the sheet resistance does not increase even at 1,000° C. because of the above-described effects, so the resistance to the agglomeration increases.

In this embodiment, the titanium film layer is used as the upper layer. However, a pure metal film layer formed of tungsten, molybdenum, or the like, or an insulating film layer such as a silicon oxide film or a nitride film may also be used. If a silicide is simply used as a wiring layer, a silicide film layer formed of platinum silicide, tungsten silicide, or the like can be used.

In this embodiment, the cobalt and titanium film layers are formed to have a thickness of 10 nm. However, the same effects were confirmed when these films had a thickness of 5 to 40 nm. That is, it was confirmed that, although the present invention was effectively implemented for a thin film, a thick film could also achieve sufficient improvement as compared to the prior art.

Figure 4A:
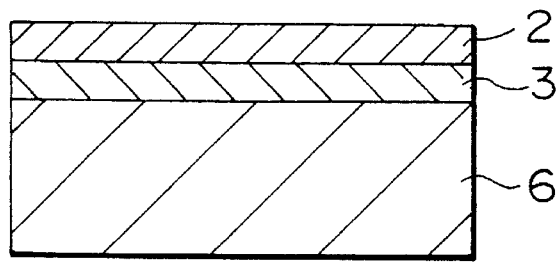
FIGS. 4A and 4B are sectional views of a semiconductor device, which explain another embodiment of the present invention.
Figure 4B:
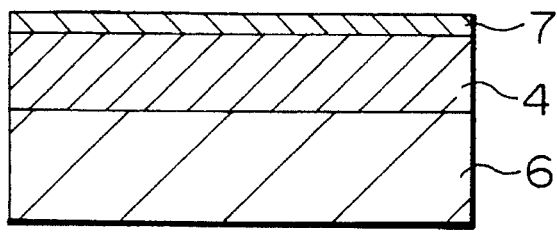

FIGS. 4A and 4b are sectional views showing another embodiment in which the present invention is applied to a wiring layer. As shown in FIG. 4A, a cobalt film layer 3 and a titanium film layer 2 are sequentially formed on a polysilicon substrate 6 used as a wiring layer. The Co film layer 3 and the Ti film layer 2 have a thickness of 10 nm. This sample is annealed using the RTA method in a nitrogen atmosphere at 600° to 700° C. for 30 seconds. The cobalt film layer 3 is reacted with the silicon substrate to form a cobalt silicide layer 4 having a thickness of about 30 nm, as shown in FIG. 4B. Because of the effect of the stress of the titanium film layer 2 or the like, this cobalt silicide layer 4 has one specific crystal orientation to increase the resistance against agglomeration, as compared to a case wherein the titanium film layer 2 is not formed. In addition, three-dimensional patterns at an interface with respect to the polysilicon substrate 6 are almost eliminated. Furthermore, since a titanium nitride film layer 7 is simultaneously formed on the silicide layer 4, this titanium nitride film layer 7 can be used as a barrier metal.

What is claimed is:

1. A method of manufacturing a semiconductor device, comprising the steps of: forming, on a silicon substrate, a first film to be converted into a silicide; continuously forming a second film on said first film; and annealing a structure body constituted by said silicon substrate, said first film and said second film at a temperature at which said first film is reacted with said silicon substrate, thereby forming a silicide; and removing said second film from said silicide; wherein said first and second films are formed to have a thickness of about 5 to 40 nm; and wherein said second film is formed of a material selected from the group consisting of a platinum silicide and a tungsten silicide.

* * * * *